US012733101B2

(12) United States Patent
Ogata et al.

(10) Patent No.: US 12,733,101 B2
(45) Date of Patent: Sep. 8, 2026

(54) PRINTED WIRING BOARD

(71) Applicant: SUMITOMO ELECTRIC PRINTED CIRCUITS, INC., Shiga (JP)

(72) Inventors: Michi Ogata, Shiga (JP); Kou Noguchi, Shiga (JP)

(73) Assignee: SUMITOMO ELECTRIC PRINTED CIRCUITS, INC., Shiga (JP)

( * ) Notice: Subject to any disclaimer, the term of this patent is extended or adjusted under 35 U.S.C. 154(b) by 200 days.

(21) Appl. No.: 18/294,835

(22) PCT Filed: Jul. 28, 2022

(86) PCT No.: PCT/JP2022/029202
§ 371 (c)(1),
(2) Date: Feb. 2, 2024

(87) PCT Pub. No.: WO2023/013525
PCT Pub. Date: Feb. 9, 2023

(65) Prior Publication Data

US 2024/0431030 A1 Dec. 26, 2024

(30) Foreign Application Priority Data

Aug. 5, 2021 (JP) ................................ 2021-129097

(51) Int. Cl.

| | |
|---|---|
| ***H05K 1/16*** | (2006.01) |
| ***H05K 1/02*** | (2006.01) |
| ***H05K 3/10*** | (2006.01) |
| *H01F 27/28* | (2006.01) |

(52) U.S. Cl.
CPC .......... *H05K 1/165* (2013.01); *H05K 1/0218* (2013.01); *H05K 3/108* (2013.01); *H01F 27/2804* (2013.01); *H01F 2027/2809* (2013.01); *H05K 2201/0715* (2013.01); *H05K 2201/09236* (2013.01); *H05K 2201/09263* (2013.01); *H05K 2201/0939* (2013.01); *H05K 2201/09727* (2013.01)

(58) Field of Classification Search
CPC .. H05K 1/0263; H05K 1/0265; H05K 1/0293; H05K 1/0296
See application file for complete search history.

(56) References Cited

U.S. PATENT DOCUMENTS

| | | | |
|---|---|---|---|
| 2019/0244743 A1 | 8/2019 | Hirai et al. | |
| 2021/0219424 A1* | 7/2021 | Nitta .................... | H05K 1/118 |

FOREIGN PATENT DOCUMENTS

| | | |
|---|---|---|
| JP | 2012089700 A | 5/2012 |
| JP | 2012169597 A | 9/2012 |
| JP | 2015082535 A | 4/2015 |
| JP | 2019134141 A | 8/2019 |

* cited by examiner

*Primary Examiner* — Jeremy C Norris
(74) *Attorney, Agent, or Firm* — Renner, Otto, Boisselle & Sklar, LLP

(57) ABSTRACT

The printed wiring board according to an embodiment of the present disclosure comprises: a substrate; a first wiring layer having a first wiring that is disposed directly or indirectly on the substrate; and a second wiring layer having a second wiring that is disposed directly or indirectly on the substrate. The average wire width of the first wiring is 40 μm or less, and the average wire width of the second wiring is 50 μm or more.

11 Claims, 3 Drawing Sheets

PRINTED WIRING BOARD

TECHNICAL FIELD

The present disclosure relates to a printed wiring board. The present application claims priority based on Japanese Patent Application No. 2021-129097 filed on Aug. 5, 2021, and the entire contents of the Japanese patent application are incorporated herein by reference.

BACKGROUND ART

Printed wiring boards are widely used to constitute circuits of various electronic devices. In recent years, with the reduction in the sizes of electronic devices, the sizes of printed wiring boards have been significantly reduced, leading to a notable increase in wiring density of printed wiring boards.

As an example of such a printed wiring board, there has been proposed a printed wiring board that is used together with a magnet and that constitutes an actuator together with the magnet (see Japanese Unexamined Patent Application Publication No. 2012-89700). In this printed wiring board, a wiring line is formed on a substrate by a semi-additive method.

CITATION LIST

Patent Literature

PTL 1: Japanese Unexamined Patent Application Publication No. 2012-89700

SUMMARY OF INVENTION

A printed wiring board according to an aspect of the present disclosure includes a substrate, a first wiring layer including a first wiring line directly or indirectly disposed on the substrate, and a second wiring layer including a second wiring line directly or indirectly disposed on the substrate. An average line width of the first wiring line is 40 μm or less. An average line width of the second wiring line is 50 μm or more.

DESCRIPTION OF EMBODIMENTS

Figure 1:
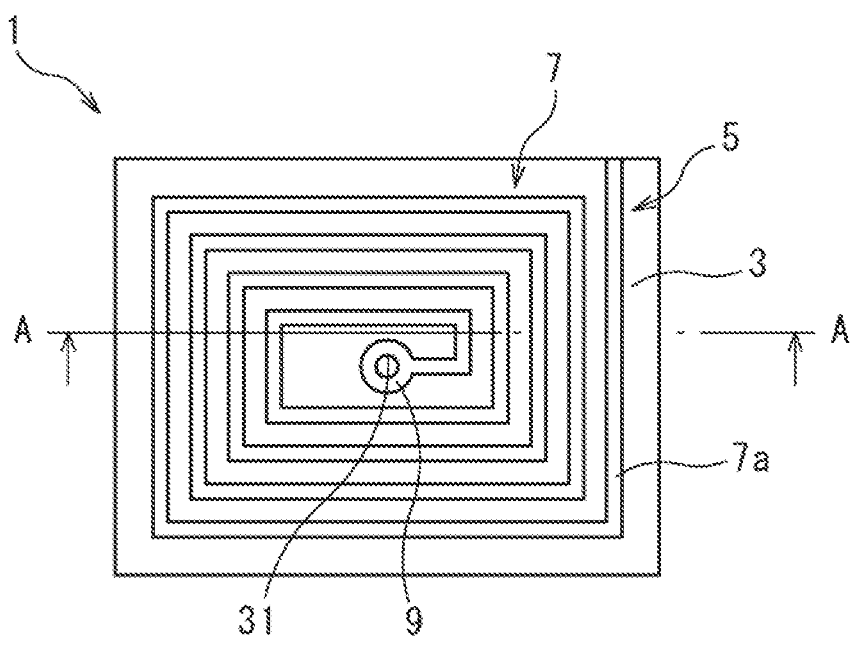
FIG. 1 is a schematic plan view illustrating a surface of a printed wiring board according to a first embodiment on which a first wiring layer is formed.

Problems to be Solved by Present Disclosure

When a printed wiring board is regarded as a component of the above-mentioned actuator or the like, the printed wiring board desirably includes a wiring line having a relatively small line width and a wiring line having a relatively large line width because it allows the printed wiring board to have other functions in addition to its power transmission function. In addition, it is desirable that the printed wiring board can have other functions in this way, as it eliminates the need for other components to exhibit those functions. As a result, the number of components can be reduced, achieving a simple configuration.

However, in a printed wiring board such as that described above, wiring lines are formed by the semi-additive method, and thus, it is difficult to simultaneously form wiring lines each having a relatively large line width.

Accordingly, it is an object to provide a printed wiring board capable of having a simple configuration while having other functions in addition to the power transmission function.

[Advantageous Effects of Present Disclosure]

According to the printed wiring board of the present disclosure, a simple configuration of the printed wiring board can be achieved while the printed wiring board has other functions in addition to the power transmission function.

Description of Embodiments of Present Disclosure

First, embodiments of the present disclosure will be enumerated and described.

(1) A printed wiring board according to an aspect of the present disclosure includes a substrate, a first wiring layer including a first wiring line directly or indirectly disposed on the substrate, and a second wiring layer including a second wiring line directly or indirectly disposed on the substrate. An average line width of the first wiring line is 40 μm or less. An average line width of the second wiring line is 50 μm or more.

The first wiring layer that includes the first wiring line having the average line width of 40 μm or less can be formed by the semi-additive method. The second wiring layer that includes the second wiring line having the average line width of 50 μm or more can be formed by a subtractive method. The first wiring layer formed by the semi-additive method can be reduced in size. The second wiring layer formed by the subtractive method can have, in addition to the power transmission function which is an original function of a wiring layer, other functions including a function of mounting another component, a shielding function, and a connection function. Therefore, since the printed wiring board includes the first wiring layer and the second wiring layer, the printed wiring board can have a simple configuration while having the other functions in addition to the power transmission function. Note that, in the present disclosure, the term "power transmission function" includes a coil function.

(2) In (1), the first wiring layer may include a plurality of the first wiring lines, or the first wiring line may be bent so as to have portions adjacent to each other, and an average pitch between the adjacent first wiring lines may be 25 μm to 45 μm.

In this manner, when the average pitch between the adjacent first wiring lines is equal to or more than the lower limit, the occurrence of a short-circuit can be suppressed. On the other hand, when the average pitch between the plurality of first wiring lines is equal to or less than the upper limit, a reduction in the size of the first wiring layer can be further facilitated.

(3) In (1) or (2), an average height of the first wiring line may be 40 μm to 60 μm.

In this manner, when the average height of the first wiring line is equal to or more than the lower limit, a possibility that the resistance of the first wiring line may become excessively large with an increase in a wiring density can be reduced. On the other hand, when the average height of the first wiring line is equal to or less than the lower limit, a possibility that the printed wiring board may become unnecessarily thick can be reduced.

(4) In any one of (1) to (3), the average line width of the first wiring line may be 10 μm or more.

In this manner, when the average line width of the first wiring line is equal to or more than the lower limit, the difficulty in forming the first wiring line by the semi-additive method can be suppressed. In addition, the adhesion strength between the substrate and the first wiring line can be increased, and as a result, separation of the first wiring line from the substrate can be suppressed.

(5) In any one of (1) to (4), the second wiring line may include a mounting pad portion.

When the second wiring line includes the mounting pad portion as mentioned above, the printed wiring board can have, in addition to the power transmission function of the first wiring layer that is reduced in size as described above, a mounting function of mounting another device by using the mounting pad portion of the second wiring layer. The printed wiring board having the mounting function in this manner exhibits enhanced functionality.

(6) In any one of (1) to (5), the second wiring line may include a shield portion.

When the second wiring line includes the shield portion as mentioned above, the printed wiring board can have, in addition to the power transmission function provided by the first wiring layer that is reduced in size as described above, the shielding function of the shield portion of the second wiring layer. The printed wiring board having the shielding function in this manner exhibits enhanced functionality.

(7) In any one of (1) to (6), the second wiring line may include a connector portion.

When the second wiring line includes the connector portion as mentioned above, the printed wiring board can have, in addition to the power transmission function provided by the first wiring layer that is reduced in size as described above, the connection function of the connector portion of the second wiring layer. The printed wiring board having the connection function in this manner exhibits enhanced functionality.

(8) In any one of (1) to (7), a cross-sectional shape of the first wiring line, the cross-sectional shape being perpendicular to an axial direction of the first wiring line, may be widened from the substrate toward an end portion of the first wiring line, and the end portion may have a curved shape. Here, the term "axial direction" refers to a length direction.

As described above, since the average line width of the first wiring line is relatively small, when an electrically insulating layer is laminated on the first wiring line, there is a possibility that the electrically insulating layer may easily become separated from the first wiring line. However, since the first wiring line has the above-mentioned shape, an anchor effect can be exhibited, and thus, the electrically insulating layer can be made less likely to become separated from the first wiring line.

(9) In any one of (1) to (8), a cross-sectional shape of the second wiring line, the cross-sectional shape being perpendicular to an axial direction of the second wiring line, may be tapered from the substrate toward an end portion of the second wiring line.

In this manner, when the second wiring line has the above-mentioned shape, an adhesion area of the second wiring line to the substrate is increased, and thus, the adhesion strength of the second wiring line to the substrate can be improved.

(10) In any one of (1) to (9), the first wiring layer may be a layer formed by the semi-additive method, and the second wiring layer may be a layer formed by the subtractive method.

When the first wiring layer is a layer formed by the semi-additive method as mentioned above, it becomes easier to form the first wiring layer that includes the first wiring line having the average line width, which is relatively small. When the second wiring layer is a layer formed by the subtractive method, it becomes easier to form the second wiring line having the average line width, which is relatively large, and a relatively uniform height.

Here, the phrase "when viewed in plan view" refers to viewing the substrate in a perpendicular direction. The term "average line width" refers to an average of maximum line widths at arbitrary ten positions in the axial direction. In the case where a wiring line includes a linear portion that has a power transmission function, the phrase "average line width of the wiring line" refers to an average line width of the linear portion, and in the case where the wiring line does not include the linear portion, the phrase "average line width of the wiring line" refers to an average line width of the entire wiring line. The phrase "average pitch between adjacent wiring lines" refers to an average of center-to-center distances in a line width direction between adjacent wiring lines at arbitrary ten positions in the axial direction. The term "average height" refers to an average of maximum heights in cross sections perpendicular to the axial direction at arbitrary ten positions in the axial direction. In the case where the wiring line includes the linear portion, the phrase "average height of the wiring line" refers to an average height of the linear portion, and in the case where the wiring line does not include the linear portion, the phrase "average height of the wiring line" refers to an average height of the entire wiring line.

Details of Embodiments of Present Disclosure

Printed wiring boards according to embodiments of the present disclosure will be described in detail below with reference to the drawings.

First Embodiment

[Printed Wiring Board]

Figure 2:
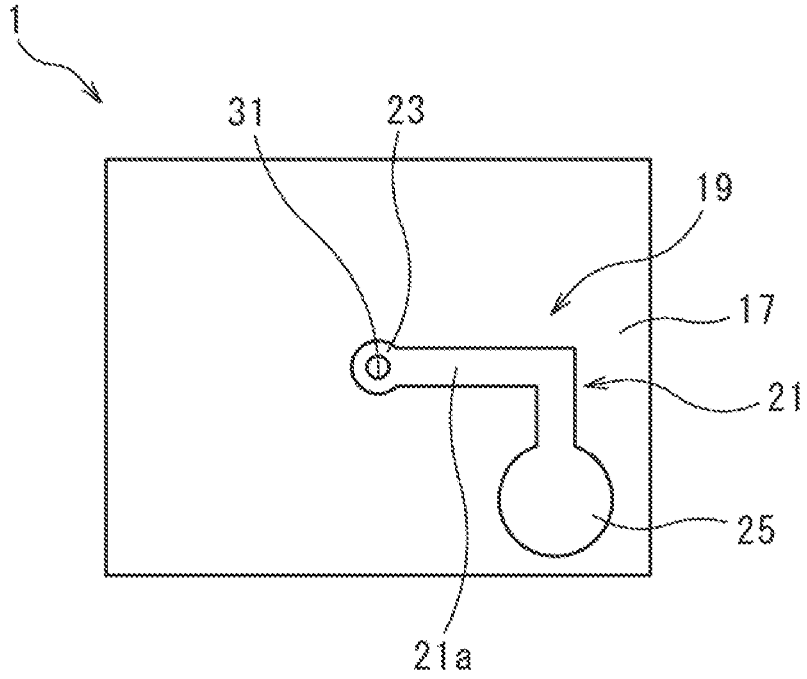
FIG. 2 is a schematic plan view illustrating another surface of the printed wiring board illustrated in FIG. 1 on which a second wiring layer is formed.
Figure 3:
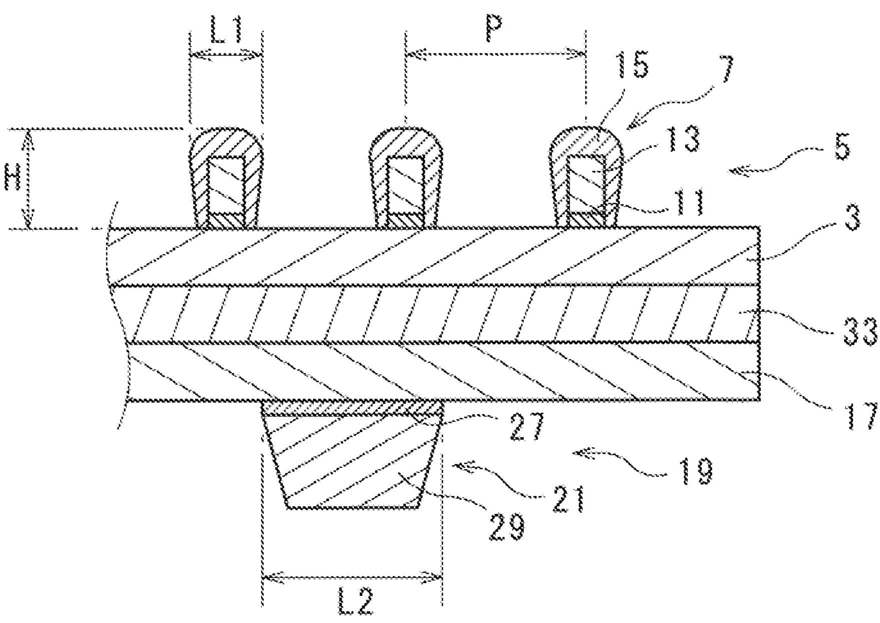
FIG. 3 is a schematic sectional view of the printed wiring board illustrated in FIG. 1 taken along line A-A.

As illustrated in FIG. 1, FIG. 2, and FIG. 3, a printed wiring board 1 of the present embodiment includes a first substrate 3, a first wiring layer 5 that includes a first wiring line 7 directly or indirectly disposed on the first substrate 3, and a second wiring layer 19 that includes a second wiring line 21 directly or indirectly disposed on the first substrate 3. In the present embodiment, the first wiring layer 5 is disposed directly on the first substrate 3. In addition, in the present embodiment, the second wiring layer 19 is indirectly disposed on the first substrate 3. An average line width L1 of the first wiring line 7 is 40 μm or less, and an average line width L2 of the second wiring line 21 is 50 μm or more.

The printed wiring board 1 of the present embodiment further includes a second substrate 17 and an adhesive layer 33 that bonds the first substrate 3 and the second substrate 17 to each other. The first wiring layer 5, the first substrate 3, the adhesive layer 33, the second substrate 17, and the second wiring layer 19 are stacked on top of one another in this order. More specifically, the first wiring layer 5 is formed on a first surface (an upper surface in FIG. 3) of the first substrate 3, whereas a first wiring layer 5 is not formed on a second surface (a lower surface in FIG. 3) of the first substrate 3, the second surface being opposite to the first surface. In addition, a second wiring layer 19 is not formed on a third surface (an upper surface in FIG. 3) of the second substrate 17, the third surface facing the first substrate 3, whereas the second wiring layer 19 is formed on a fourth surface (a lower surface in FIG. 3) of the second substrate 17, the fourth surface being opposite to the third surface. Furthermore, the second surface of the first substrate 3 and the third surface of the second substrate 17 are bonded together with the adhesive layer 33. In this aspect, the first wiring layer 5 is directly disposed on the first substrate 3, and the second wiring layer 19 is indirectly disposed on the first substrate 3 with the adhesive layer 33 and the second substrate 17 interposed therebetween. The first wiring layer 5 and the second wiring layer 19 may be arranged at positions that overlap each other when viewed in plan view or may be arranged at positions that do not overlap each other when viewed in plan view.

The printed wiring board 1 of the present embodiment further includes a via portion 31 that is formed to extend through the first substrate 3, a first land portion 9 of the first wiring line 7, the second substrate 17, and a second land portion 23 of the second wiring line 21.

In the present embodiment, the second wiring line 21 includes a mounting pad portion 25.

(First Substrate)

The first substrate 3 is a layer made of a synthetic resin having an electrically insulating property. The first substrate 3 is a substrate for forming the first wiring layer 5. The first substrate 3 is formed of a plate-shaped member having an electrically insulating property. The plate-shaped member forming the first substrate 3 may be a rigid substrate or may be a flexible substrate. Specifically, a resin plate can be used as the rigid substrate. Examples of a main component of this resin plate include glass epoxy and so forth. Specifically, a resin film can be used as the flexible substrate having flexibility. Examples of a main component of this resin film include a polyimide, polyethylene terephthalate, a liquid crystal polymer, a fluorocarbon resin, and so forth. The term "main component" refers to a component with the highest content, meaning, for example, a component that constitutes 50 mass % or more of a forming material. The first substrate 3 may contain a resin other than the above-mentioned resins, an additive such as an antistatic agent or a filler, or the like.

Although the lower limit of an average thickness of the first substrate 3 is not particularly limited, it is preferably 5 μm, and more preferably 10 μm. Although the upper limit of the average thickness of the first substrate 3 is not particularly limited, it is preferably 200 μm, more preferably 150 μm, still more preferably 100 μm, and particularly preferably 50 μm. If the average thickness of the first substrate 3 is less than the lower limit, there is a possibility that the electrical insulation strength and the mechanical strength of the first substrate 3 may be insufficient. On the other hand, if the average thickness of the first substrate 3 exceeds the upper limit, there is a possibility that the first substrate 3 may interfere with another component. Note that the term "average thickness" refers to an average of thicknesses measured at arbitrary ten positions.

(First Wiring Layer)

The first wiring layer 5 is disposed directly on the first surface of the first substrate 3 and includes the first wiring line 7 that forms a planar coil having a spiral shape. The first wiring line 7 includes the first land portion 9 at an inner peripheral end portion thereof. More specifically, as illustrated in FIG. 1, the first wiring line 7 includes a linear portion 7*a* that has a power transmission function and the first land portion 9 that is connected to an inner end of the linear portion 7*a*.

As illustrated in FIG. 3, the first wiring line 7 includes a first electrically-conductive underlayer 11, a first plating layer 13, and a second plating layer 15. The first electrically-conductive underlayer 11 is disposed on the first surface of the first substrate 3. The first plating layer 13 is disposed on the first electrically-conductive underlayer 11. The second plating layer 15 is disposed so as to cover the first electrically-conductive underlayer 11 and the first plating layer 13. In other words, the first wiring line 7 is a coated member whose outer peripheral surface, which is exposed at the first substrate 3, is formed of the second plating layer 15. The second plating layer 15 functions as a coating layer that increases the line width and the height of the first wiring line 7.

Examples of a material for the first electrically-conductive underlayer 11 include copper (Cu), silver (Ag), gold (Au), nickel (Ni), titanium (Ti), chromium (Cr), alloys thereof, and stainless steel.

Examples of a metal material for the first plating layer 13 include copper, aluminum, silver, gold, nickel, and alloys thereof. Among these, copper or a copper alloy is preferable from the standpoints of improving electrical conductivity and reducing manufacturing costs.

Examples of a metal material for the second plating layer 15 include metal materials similar to the above-mentioned first plating layer 13.

The upper limit of the average line width L1 of the first wiring line 7 is 40 μm, more preferably 35 μm, and still more preferably 30 μm. If the average line width L1 of the first wiring line 7 exceeds the upper limit, there is a possibility that the wiring density may not satisfy a requirement. In addition, it may be difficult to achieve a sufficient size reduction of the first wiring layer 5. On the other hand, the lower limit of the average line width L1 of the first wiring line 7 is preferably 10 μm, more preferably 15 μm, and still more preferably 20 μm. If the average line width L1 of the first wiring line 7 is less than the lower limit, it may be difficult to form the first wiring line 7 by the semi-additive method. In addition, there is a possibility that the adhesion strength between the first substrate 3 and the first wiring line 7 may be reduced, which in turn results in separation of the first wiring line 7 from the first substrate 3.

The first wiring line 7 is bent so as to have portions that are adjacent to each other. More specifically, in the present embodiment, the first wiring line 7 includes a winding portion that is wound in a spiral shape, and the first wiring line 7 is arranged parallel to a line width direction in this winding portion. The lower limit of an average pitch P between the adjacent portions of the first wiring line 7 is preferably 25 μm, and more preferably 30 μm. If the average pitch P is less than the lower limit, there is a possibility that a short-circuit may occur between the portions of the first wiring line 7. On the other hand, the upper limit of the average pitch P is preferably 45 μm, and more preferably 40 μm. If the average pitch P exceeds the upper limit, there is a possibility that the wiring density may not satisfy a requirement.

The lower limit of an average height H of the first wiring line 7 is preferably 40 μm, and more preferably 45 μm. If the average height H of the first wiring line 7 is less than the lower limit, there is a possibility that the resistance of the first wiring line 7 may become excessively large with an increase in the wiring density. On the other hand, the upper limit of the average height H of the first wiring line 7 is preferably 60 μm, and more preferably 55 μm. If the average height H of the first wiring line 7 exceeds the upper limit, there is a possibility that the printed wiring board 1 may become unnecessarily thick.

The first wiring layer 5 can be formed by using the semi-additive method or the like. For example, first, an electrically-conductive underlayer is disposed on the first surface of the first substrate 3. Subsequently, a resist pattern is formed on the electrically-conductive underlayer. Next, electrolytic plating is performed on a surface of the electrically-conductive underlayer that is exposed through the resist pattern, so that the first plating layer 13 is formed. In addition, the resist pattern is removed, and then, the electrically-conductive underlayer exposed between portions of the first plating layer 13 is etched so as to form the first electrically-conductive underlayer 11. The first electrically-conductive underlayer 11 and the first plating layer 13 are plated, so that a second plating layer 15 is formed. In this manner, the first wiring layer 5 can be formed on the first substrate 3.

Since the first wiring layer 5 is a layer formed by the semi-additive method as mentioned above, it becomes easier to form the first wiring layer 5 that includes the first wiring line 7 having the average pitch P, which is relatively small as mentioned above. Here, when a wiring line having a relatively large line width and a wiring line having a relatively small line width are simultaneously formed by the semi-additive method, a relatively large amount of plating is likely to adhere to the wiring line having the relatively large line width. Consequently, it can be said that the semi-additive method is a method with which it is difficult to form wiring lines having small variations in height. However, by combining the first wiring layer 5 that includes the first wiring line 7 and that is formed by the semi-additive method with the second wiring layer 19 that includes the second wiring line 21 and that is formed by the subtractive method, which will be described later, the printed wiring board 1 including the first wiring layer 5 that includes the first wiring line 7 having a relatively small line width and the second wiring layer 19 that includes the second wiring line 21 having a relatively large line width is obtained.

By forming the first wiring line 7 by the semi-additive method as mentioned above, when viewed in a transverse cross-section (a cross-section perpendicular to the axial direction) as illustrated in FIG. 3, the shape of the first wiring line 7 is widened from the first substrate 3 toward an end portion of the first wiring line 7, and the end portion has a curved shape.

Here, since the average line width L1 of the first wiring line 7 is relatively small as mentioned above, in the case where an electrically insulating layer is laminated on the first wiring line 7, there is a possibility that the electrically insulating layer may easily become separated from the first wiring line 7. However, since the first wiring line 7 has the above-described shape, the anchor effect can be exhibited, and thus, the electrically insulating layer can be made less likely to become separated from the first wiring line 7.

(Second Substrate)

As the second substrate 17, a substrate similar to the first substrate 3 can be used.

(Second Wiring Layer)

The second wiring layer 19 includes the second wiring line 21 that is indirectly disposed on the first substrate 3 with the adhesive layer 33 and the second substrate 17 interposed therebetween. Here, the second wiring layer 19 is disposed on the fourth surface of the second substrate 17. The second wiring line 21 includes the second land portion 23 at one end thereof and the mounting pad portion 25 at the other end thereof. More specifically, as illustrated in FIG. 2, the second wiring line 21 includes a linear portion 21*a* that has a power transmission function, the second land portion 23 that is connected to one end of the linear portion 21*a*, and the mounting pad portion 25 that is connected to the other end of the linear portion 21*a*. The mounting pad portion 25 is a portion onto which another device can be mounted.

As illustrated in FIG. 3, the second wiring line 21 includes a second electrically-conductive underlayer 27 that is disposed on the fourth surface of the second substrate 17 and a third plating layer 29 that is disposed on the second electrically-conductive underlayer 27. The second electrically-conductive underlayer 27 and the third plating layer 29 are exposed at an outer peripheral surface of the second wiring line 21.

Examples of a material for the second electrically-conductive underlayer 27 include materials similar to the above-mentioned materials for the first electrically-conductive underlayer 11.

Examples of a metal material for the third plating layer 29 include metal materials similar to the above-mentioned materials for the first plating layer 13.

The lower limit of the average line width L2 of the second wiring line 21 is 50 μm, more preferably 75 μm, and still more preferably 100 μm. If the average line width L2 is less than the lower limit, it may be difficult to form the second wiring line 21 by the subtractive method. In addition, there is a possibility that the adhesion strength between the second substrate 17 and the second wiring line 21 may be reduced, which in turn results in separation of the second wiring line 21 from the second substrate 17. On the other hand, the upper limit of the average line width L2 of the second wiring line 21 is preferably 200 μm, and more preferably 150 μm. If the average line width L2 exceeds the upper limit, there is a possibility that the wiring density may not satisfy a requirement.

Although not illustrated, in the case where the linear portions 21*a* of a plurality of the second wiring lines 21 are arranged adjacent to each other, the lower limit of an average pitch between the adjacent second wiring lines 21 is preferably 150 μm, more preferably 175 μm, and still more preferably 200 μm. If the average pitch is less than the lower limit, there is a possibility that a short-circuit may occur between the second wiring lines 21. On the other hand, the upper limit of the average pitch is suitably set depending on applications or the like and is not particularly limited.

The lower limit of the average height of the second wiring line 21 is preferably 15 μm, more preferably 20 μm, and still more preferably 25 μm. If the average height of the second wiring line 21 is less than the lower limit, there is a possibility that the resistance of the second wiring line 21 may become excessively large with an increase in the wiring density. On the other hand, the upper limit of the average height of the second wiring line 21 is preferably 40 μm, more preferably 35 μm, and still more preferably 30 μm. If the average height of the second wiring line 21 exceeds the upper limit, there is a possibility that the printed wiring board 1 may become unnecessarily thick.

The aspect ratio of the first wiring line 7 may be larger than the aspect ratio of the second wiring line 21. Such a configuration facilitates providing the second wiring line 21 with other functions while enhancing the power transmission function of the first wiring line 7. Note that the phrase "aspect ratio of a wiring line" refers to the average ratio of maximum height to line width in cross sections perpendicular to the axial direction at arbitrary ten positions in the axial direction of the linear portion.

The shape of the mounting pad portion 25 when viewed in plan view may be suitably set such that a minimum diameter of the mounting pad portion 25 is larger than the average line width of the linear portion 21*a* of the second wiring line 21. The mounting pad portion 25 has, for example, a circular shape when viewed in plan view. The term "circular shape" refers to general round shapes, including an elliptical shape, an oval shape, and the like. The mounting pad portion 25 may be disposed away from the outer edge of the second substrate 17. In addition, the mounting pad portion 25 may be disposed at a position where it overlaps the first wiring line 7 when viewed in plan view or may be disposed at a position where it does not overlap the first wiring line 7 when viewed in plan view. Note that, when the minimum diameter of the mounting pad portion 25 is larger than the average line width of the linear portion 21*a*, the average line width of the second wiring line 21 including the mounting pad portion 25 is 50 μm or more. On the other hand, a maximum diameter of the mounting pad portion 25 may be suitably set in accordance with, for example, a dimension of a component to be mounted.

The second wiring layer 19 can be formed by using the subtractive method. For example, an electrically-conductive underlayer is disposed on the above-mentioned fourth surface, and then, electrolytic plating is performed on the entire surface of the electrically-conductive underlayer, so that a plating layer is formed. In addition, a resist pattern is formed on the plating layer, and the electrically-conductive underlayer and the plating layer are etched by using the resist pattern as a mask. As a result, the second electrically-conductive underlayer 27 is formed by etching the electrically-conductive underlayer, and the third plating layer 29 is formed by etching the plating layer. After the etching, the resist pattern is removed so as to form the second wiring line 21. In the manner described above, the second wiring layer 19 is formed on the fourth surface of the second substrate 17. As a result, the second wiring layer 19 is indirectly formed on the first substrate 3.

As described above, since the second wiring layer 19 is a layer formed by the subtractive method, it becomes easier to form the second wiring line 21 that has a relatively large line width and a relatively uniform height. It can be said that the subtractive method is a method in which it is difficult to manufacture a wiring having a relatively small line width. However, by combining the second wiring layer 19 that includes the second wiring line 21 formed by the subtractive method with the first wiring layer 5 that includes the first wiring line 7 formed by the semi-additive method, the printed wiring board 1 including the first wiring layer 5 that includes the first wiring line 7 having a relatively small line width and the second wiring layer 19 that includes the second wiring line 21 having a relatively large line width is obtained.

By forming the second wiring line 21 by the subtractive method as mentioned above, when viewed in a transverse cross-section (a cross-section perpendicular to the axial direction) of the second wiring line 21 as illustrated in FIG. 3, the shape of the second wiring line 21 is tapered from the first substrate 3 toward an end portion of the second wiring line 21. More specifically, when viewed in the transverse cross-section, the shape of the second wiring line 21 is a trapezoidal shape having a bottom surface as its lower base and an end surface opposite to the bottom surface as its upper base. Note that the mounting pad portion 25 also has a trapezoidal shape similar to that described above when viewed in the transverse cross-section.

In this manner, since the second wiring line 21 has the above-described shape, an adhesion area of the second wiring line 21 to the second substrate 17 is increased, and thus, an adhesion area of the second wiring line 21 to the first substrate 3 is also indirectly increased. Therefore, the adhesion strength of the second wiring line 21 to the first substrate 3 can be improved.

(Adhesive Layer)

As the adhesive layer 33, a layer that is made of a known adhesive having an electrically insulating property can be used. The adhesive is applied to at least one of the second surface (the lower surface in FIG. 3) of the first substrate 3 on which the first wiring layer 5 is not formed and the third surface (the upper surface in FIG. 3) of the second substrate 17 on which the second wiring layer 19 is not formed, and then, the first substrate 3 and the second substrate 17 are bonded to each other with the adhesive, so that the first substrate 3 and the second substrate 17 are bonded to each other, and the adhesive layer 33 is formed.

<Method of Manufacturing Printed Wiring Board>

As described above, the printed wiring board 1 of the present embodiment can be manufactured in the following manner. The first wiring layer 5 is formed onto the first substrate 3 by using the semi-additive method, and the second wiring layer 19 is formed onto the second substrate 17 by using the subtractive method. Then, as described above, the first substrate 3 and the second substrate 17 are bonded together with the adhesive layer 33.

In the printed wiring board 1, the first wiring layer 5 that includes the first wiring line 7 having the average line width of 40 μm or less can be formed by the semi-additive method, and the second wiring layer 19 that includes the second wiring line 21 having the average line width of 50 μm or more can be formed by the subtractive method. The first wiring layer 5 formed by the semi-additive method can be reduced in size. The second wiring layer 19 formed by the subtractive method can have other functions including a function of mounting another component in addition to the power transmission function which is an original function of a wiring layer. Therefore, since the printed wiring board 1 includes the first wiring layer 5 and the second wiring layer 19, the printed wiring board 1 can have a simple configuration while having other functions in addition to the power transmission function.

In the present embodiment, since the second wiring line 21 includes the mounting pad portion 25, the printed wiring board 1 can have, in addition to the power transmission function of the first wiring layer 5 that is reduced in size as described above, a mounting function of mounting another device by using the mounting pad portion 25 of the second wiring layer 19. The printed wiring board 1 having the mounting function in this manner exhibits enhanced functionality.

Second Embodiment

[Printed Wiring Board]

Figure 4:
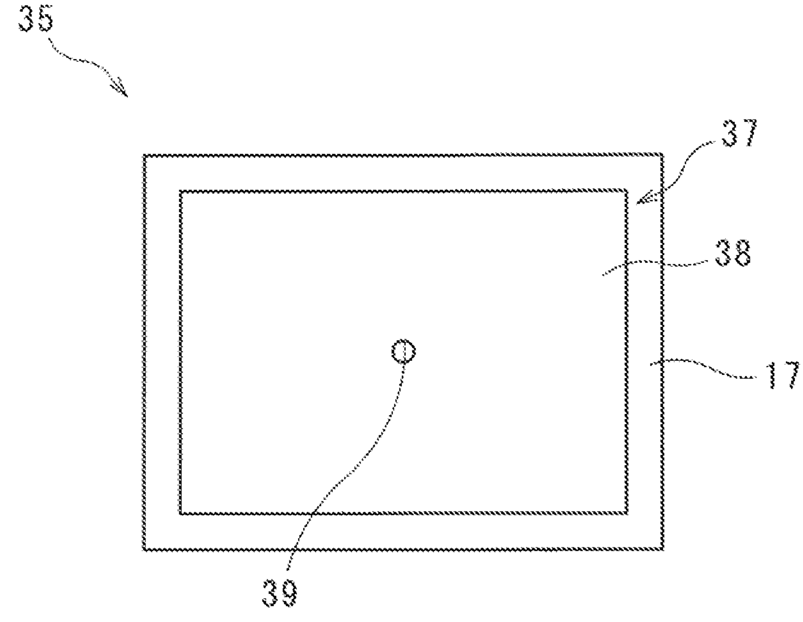
FIG. 4 is a schematic plan view illustrating a surface of a printed wiring board according to a second embodiment on which a second wiring layer is formed.

As illustrated in FIG. 4, a printed wiring board 35 of the present embodiment includes, instead of the second wiring layer 19 including the second wiring line 21, which includes the mounting pad portion 25, a second wiring layer 37 including a second wiring line 38 that includes a shield portion. In addition, the printed wiring board 35 of the present embodiment includes a via portion 39 that is formed so as to extend through the first wiring layer 5, the first substrate 3, the adhesive layer 33, the second substrate 17, and the second wiring line 38. The rest of the configuration is the same as the first embodiment. Accordingly, only the second wiring layer 37 that is different from the first embodiment will be described below.

(Second Wiring Layer)

In the present embodiment, the second wiring layer 37 is formed on the second substrate 17. The second wiring layer 37 includes the second wiring line 38 that is formed over substantially the entire fourth surface of the second substrate 17 that serves as the shield portion. Similar to the above-mentioned second wiring line 21 of the first embodiment, the second wiring line 38 includes a second electrically-conductive underlayer that is formed on the second substrate 17 and a third plating layer that is formed on the second electrically-conductive underlayer.

(Second Wiring Line)

The second wiring line 38 serving as the shield portion is a portion that blocks electromagnetic waves. The shape of the second wiring line 38 is not particularly limited as long as the second wiring line 38 has a minimum line width of 50 μm or more and is formed in a shape capable of exhibiting a function as a shield. For example, as illustrated in FIG. 4, the second wiring line 38 may be formed in a rectangular shape when viewed in plan view. The shield portion may be a solid pattern that covers a large portion of the first wiring line 7 when viewed in plan view. The lower limit of the coverage of the first wiring line 7 with the shield portion may be 70%, may be 80%, or may be 90%. In the present embodiment, the second wiring line 38 does not include a second land portion.

The second wiring line 38 includes only the shield portion and does not include the above-mentioned linear portion. Thus, the average line width of the second wiring line 38 is determined by the average line width of the shield portion. When the minimum line width of the second wiring line 38 is 50 μm or more, the average line width of the second wiring line 38 is 50 μm or more. Thus, the lower limit of the minimum line width of the second wiring line 38 may be 50 μm and is not particularly limited. On the other hand, the upper limit of the minimum line width of the second wiring line 38 may be suitably set to such an extent that a shielding function can be exhibited.

Although not illustrated, when a plurality of the second wiring lines 38 are arranged adjacent to each other, an average pitch between the adjacent second wiring lines 38 can be suitably set such that the adjacent second wiring lines 38 do not interfere with each other's shielding function.

The average height of the second wiring line 38 may be set in a manner similar to the above-described second wiring line 21 of the first embodiment.

Note that the second wiring line 38 may include a linear portion, a land portion, and so forth in addition to the shield portion.

Similar to the above-described second wiring line 21 of the first embodiment, the second wiring line 38 can be formed by using the subtractive method. In addition, by forming the second wiring line 38 by the subtractive method in the manner described above, when viewed in a transverse cross-section (a cross-section perpendicular to the axial direction) of the second wiring line 38, the shape of the second wiring line 38 is similar to the shape of the second wiring line 21 of the first embodiment, which has been described above.

<Method of Manufacturing Printed Wiring Board>

The printed wiring board 35 of the present embodiment can be manufactured in the following manner. The first wiring layer 5 is formed onto the first substrate 3 by using the semi-additive method as in the above-described first embodiment, and the second wiring layer 37 is formed onto the second substrate 17 by using the subtractive method. Then, the first substrate 3 and the second substrate 17 are bonded together with the adhesive layer 33 as in the above-described first embodiment.

In the printed wiring board 35, the first wiring layer 5 that includes the first wiring line 7 having the average line width of 40 μm or less can be formed by the semi-additive method, and the second wiring layer 37 that includes the second wiring line 38 having the average line width of 50 μm or more can be formed by the subtractive method. The first wiring layer 5 formed by the semi-additive method can be reduced in size. The second wiring layer 37 formed by the subtractive method can have other functions including the shielding function in addition to the power transmission function which is an original function of a wiring layer. Therefore, since the printed wiring board 35 includes the first wiring layer 5 and the second wiring layer 37, the printed wiring board 35 can have a simple configuration while having other functions in addition to the power transmission function.

In the present embodiment, since the second wiring line 38 includes the shield portion, the printed wiring board 35 can have, in addition to the power transmission function provided by the first wiring layer 5 that is reduced in size as described above, the shielding function of the shield portion of the second wiring layer 37. The printed wiring board 35 having the shielding function in this manner exhibits enhanced functionality.

Third Embodiment

[Printed Wiring Board]

Figure 5:
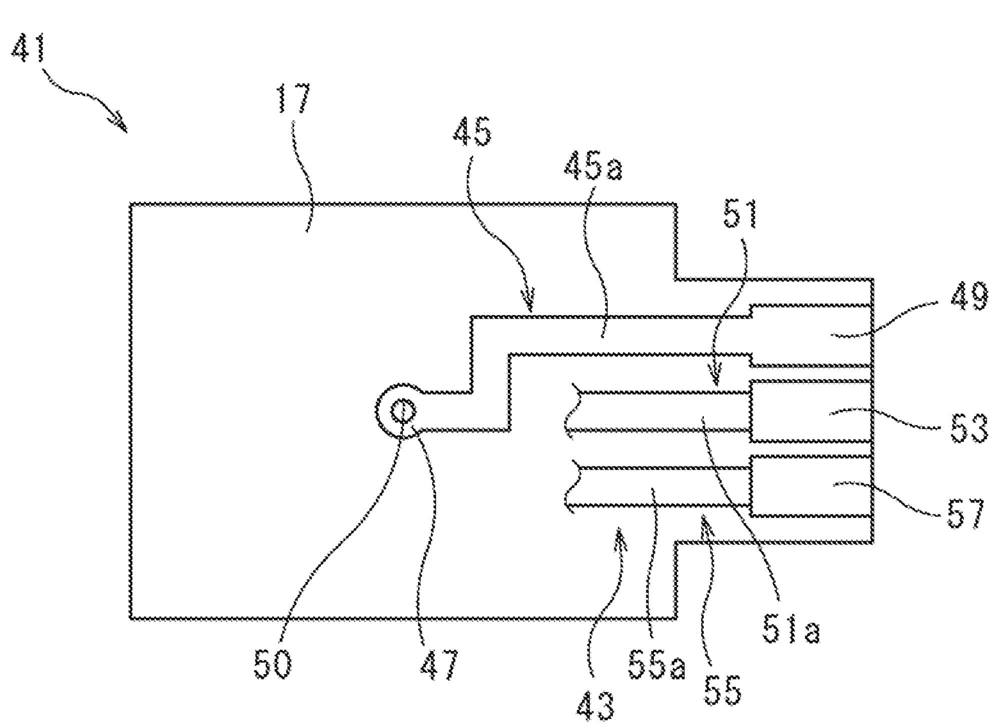
FIG. 5 is a schematic plan view illustrating a surface of a printed wiring board according to a third embodiment on which a second wiring layer is formed.

As illustrated in FIG. 5, a printed wiring board 41 of the present embodiment includes, instead of the second wiring layer 19 that includes the second wiring line 21 including the mounting pad portion 25, a second wiring layer 43 that includes second wiring lines 45, 51, and 55 including connector portions 49, 53, and 57. In addition, the printed wiring board 41 of the present embodiment includes a via portion 50 that is formed so as to extend through the first wiring layer 5, the first substrate 3, the adhesive layer 33, the second substrate 17, and a second land portion 47 of the second wiring line 45. The rest of the configuration is the same as the first embodiment. Accordingly, only the second wiring layer 43 that is different from the first embodiment will be described below.

(Second Wiring Layer)

In the present embodiment, the second wiring layer 43 is formed on the second substrate 17. The second wiring layer 43 includes the plurality of second wiring lines 45, 51, and 55 formed on the fourth surface of the second substrate 17. Similar to the above-described second wiring line 21 of the first embodiment, each of the second wiring lines 45, 51, and 55 includes a second electrically-conductive underlayer that is formed on the second substrate 17 and a third plating layer that is formed on the second electrically-conductive underlayer.

(Second Wiring Line)

The second wiring line 45 includes the second land portion 47 at one end thereof and the connector portion 49 at the other end thereof. More specifically, the second wiring line 45 includes a linear portion 45*a* that has a power transmission function, the second land portion 47 that is connected to one end of the linear portion 45*a*, and the connector portion 49 that is connected to the other end of the linear portion 45*a*. The second wiring line 51 has one end that is connected to a member, which is not illustrated, and includes the connector portion 53 at the other end thereof. More specifically, the second wiring line 51 includes a linear portion 51*a* that has a power transmission function, another member that is connected to one end of the linear portion 51*a*, and the connector portion 53 that is connected to the other end of the linear portion 51*a*. The second wiring line 55 has one end that is connected to a member, which is not illustrated, and includes the connector portion 57 at the other end thereof. More specifically, the second wiring line 55 includes a linear portion 55*a* that has a power transmission function, another member that is connected to one end of the linear portion 55*a*, and the connector portion 57 that is connected to the other end of the linear portion 55*a*. The connector portions 49, 53, and 57 are arranged parallel to one another, and accordingly, the linear portions 45*a*, 51*a*, and 55*a* of the second wiring lines 45, 51, and 55 are also arranged parallel to one another.

Each of the connector portions 49, 53, and 57 is a portion that is electrically connected to, for example, a device other than the printed wiring board 41. The shape of each of the connector portions 49, 53, and 57 may be suitably set such that the average line widths of each of the connector portions 49, 53, and 57 are respectively larger than the average line widths of the linear portions 45*a*, 51*a*, and 55*a* of the second wiring lines 45, 51, and 55 and such that the connector portions 49, 53, and 57 can exhibit the connection function. For example, the shape of each of the connector portions 49, 53, and 57 may be set to a rectangular shape such as that illustrated in FIG. 5. The plurality of connector portions 49, 53, and 57 are arranged parallel to one another and equally spaced. The connector portions 49, 53, and 57 are disposed at positions where they do not overlap the first wiring line 7 when viewed in plan view. Each of the connector portions 49, 53, and 57 may be positioned at an outer edge portion of the second substrate 17.

The lower limit of the average line width of each of the second wiring lines 45, 51, and 55 may be 50 μm and is not particularly limited. On the other hand, the upper limit of each of their average line widths may be suitably set.

The average line widths of the connector portions 49, 53, and 57 may be suitably set such that these average line widths are respectively larger than the average line widths of the second wiring lines 45, 51, and 55 (i.e., the average line widths of the linear portions 45*a*, 51*a*, and 55*a*) and such that the connector portions 49, 53, and 57 can exhibit the connection function.

An average pitch between the adjacent second wiring lines 45, 51, and 55 may be suitably set such that the connector portions 49, 53, and 57 do not come into contact with each other and such that the connector portions 49, 53, and 57 can exhibit the connection function.

An average height of the second wiring lines 45, 51, and 55 may be set in a manner similar to the average height of the second wiring line 21 of the first embodiment, which has been described above. In addition, an average height of the connector portions 49, 53, and 57 can be the same as the average height of the second wiring lines 45, 51, and 55.

Similar to the above-described second wiring line 21 of the first embodiment, the second wiring lines 45, 51, and 55 can be formed by using the subtractive method. In addition, by forming the second wiring lines 45, 51, and 55 by the subtractive method in this manner, when viewed in a transverse cross-section (a cross-section perpendicular to the axial direction) of each of the second wiring lines 45, 51, and 55, the shape of each of the second wiring lines 45, 51, and 55 is similar to the shape of the second wiring line 21 of the first embodiment, which has been described above.

<Method of Manufacturing Printed Wiring Board>

The printed wiring board 41 of the present embodiment can be manufactured in the following manner. The first wiring layer 5 is formed onto the first substrate 3 by using the semi-additive method, as in the above-described first embodiment, and the second wiring layer 43 is formed onto the second substrate 17 by using the subtractive method. Then, the first substrate 3 and the second substrate 17 are bonded together with the adhesive layer 33 as in the above-described first embodiment.

In the printed wiring board 41, the first wiring layer 5 that includes the first wiring line 7 having the average line width of 40 μm or less can be formed by the semi-additive method, and the second wiring layer 43 that includes the second wiring lines 45, 51, and 55 each having the average line width of 50 μm or more can be formed by the subtractive method. The first wiring layer 5 formed by the semi-additive method can be reduced in size. The second wiring layer 43 formed by the subtractive method can have other functions including the connection function in addition to the power transmission function which is an original function of a wiring layer. Therefore, since the printed wiring board 41 includes the first wiring layer 5 and the second wiring layer 43, the printed wiring board 41 can have a simple configuration while having other functions in addition to the power transmission function.

In the present embodiment, since the second wiring lines 45, 51, and 55 respectively include the connector portions 49, 53, and 57, the printed wiring board 41 can have, in addition to the power transmission function provided by the first wiring layer 5 that is reduced in size as described above, the connection function of the connector portions 49, 53, and 57 of the second wiring layer 43. The printed wiring board 41 having the connection function in this manner exhibits enhanced functionality.

OTHER EMBODIMENTS

It is to be understood that the embodiments disclosed herein are only illustrative and non-restrictive in all respects. The scope of the present invention is not limited by the configurations of the above-described embodiments but is defined by the claims, and is intended to include meanings equivalent to the scope of the claims and all modifications within the scope of the claims.

In the above-described embodiments, although an aspect in which the first wiring layer is disposed on the first substrate and in which the second wiring layer is disposed on the second substrate has been described, the first wiring layer may be disposed on one surface (the first surface) of the first substrate, and the second wiring layer may be disposed on the other surface (the second surface) of the first substrate. Alternatively, the first wiring layer may be disposed on both the surfaces of the first substrate while the second wiring layer may be disposed on a surface (the fourth surface) of the second substrate that is opposite to the first substrate, and the second surface of the first substrate and the third surface of the second substrate may be laminated together with the adhesive layer. Alternatively, the second wiring layer may be disposed on both the surfaces of the second substrate. In addition, the layer configuration of the printed wiring board is not particularly limited as long as it includes the first substrate, one or a plurality of first wiring layers, and one or a plurality of second wiring layers. The printed wiring board may further include one or a plurality of other substrates in addition to the first substrate and the second substrate and may include three or more first wiring layers and three or more second wiring layers.

In the above-described embodiments, although the case where the second wiring layer includes the mounting pad portion, the shield portion, and the connector portions has been described, the second wiring layer may include a portion other than the above-mentioned portions.

In the above-described embodiments, although an aspect in which the planar coil formed of the first wiring layer is wound in a rectangular shape has been illustrated, the shape of the coil is not particularly limited, and an aspect in which the coil is wound in a circular shape, an elliptical shape, or the like may be employed. In addition, the number of turns of the coil is also not particularly limited and may be suitably set in relation to a magnet or the like to be applied. Furthermore, the first wiring line may have a shape different from a planar coil.

The first wiring layer may include a plurality of first wiring lines. In this case, the plurality of first wiring lines may be arranged parallel to each other. In addition, in the case where the first wiring layer includes a plurality of first wiring lines, the average pitch between the adjacent first wiring lines can be the same as the average pitch between the adjacent portions of the first wiring line in the above-described configuration in which the first wiring line is arranged in a bent manner.

REFERENCE SIGNS LIST

1, 35, 41 printed wiring board
3 first substrate
5 first wiring layer
7 first wiring line
7*a*, 21*a*, 45*a*, 51*a*, 55*a* linear portion
9 first land portion
11 first electrically-conductive underlayer
13 first plating layer
15 second plating layer
17 second substrate
19, 37, 43 second wiring layer
21, 38, 45, 51, 55 second wiring line
23, 47 second land portion
25 mounting pad portion
27 second electrically-conductive underlayer
29 third plating layer
31, 39, 50 via portion
33 adhesive layer
49, 53, 57 connector portion
L1, L2 average line width
P average pitch
H average height

The invention claimed is:

1. A printed wiring board comprising:
a substrate;
a first wiring layer including a first wiring line directly or indirectly disposed on the substrate; and
a second wiring layer including a second wiring line directly or indirectly disposed on the substrate,
wherein the first wiring layer is a layer formed by a semi-additive method,
wherein the second wiring layer is a layer formed by a subtractive method,
wherein an average line width of the first wiring line is 40 μm or less,
wherein an average line width of the second wiring line is 50 μm or more, and
wherein a cross-sectional shape of the second wiring line, the cross-sectional shape being perpendicular to an axial direction of the second wiring line, is tapered from the substrate toward an end portion of the second wiring line.

2. The printed wiring board according to claim 1,
wherein the first wiring layer includes a plurality of the first wiring lines, or the first wiring line is bent so as to have portions adjacent to each other, and
wherein an average pitch between the adjacent first wiring lines is 25 μm to 45 μm, or an average pitch between the adjacent portions of the first wiring line is 25 μm to 45 μm.

3. The printed wiring board according to claim 1,
wherein an average height of the first wiring line is 40 μm to 60 μm.

4. The printed wiring board according to claim 1,
wherein the average line width of the first wiring line is 10 μm or more.

5. The printed wiring board according to claim 1,
wherein the second wiring line includes a mounting pad portion.

6. The printed wiring board according to claim 1,
wherein the second wiring line includes a shield portion.

7. The printed wiring board according to claim 1,
wherein the second wiring line includes a connector portion.

8. The printed wiring board according to claim 1,
wherein a cross-sectional shape of the first wiring line, the cross-sectional shape being perpendicular to an axial direction of the first wiring line, is widened from the substrate toward an end portion of the first wiring line, and the end portion has a curved shape.

9. The printed wiring board of claim 1, wherein an aspect ratio of the first wiring line is larger than an aspect ratio of the second wiring line.

10. The printed wiring board of claim 1, wherein an average height of the second wiring line is 15 μm to 40 μm.

11. The printed wiring board of claim 1, wherein, when viewed in a transverse cross-section, the shape of the second wiring line is a trapezoidal shape having a bottom surface as its lower base and an end surface opposite to the bottom surface as its upper base.

* * * * *